United States Patent [19]

Smith et al.

[11] Patent Number: 5,047,711
[45] Date of Patent: Sep. 10, 1991

[54] WAFER-LEVEL BURN-IN TESTING OF INTEGRATED CIRCUITS

[75] Inventors: William H. Smith, Poway; Chau-Shiong Chen, San Diego, both of Calif.

[73] Assignee: Silicon Connections Corporation, San Diego, Calif.

[21] Appl. No.: 397,768

[22] Filed: Aug. 23, 1989

[51] Int. Cl.⁵ .................... G01R 1/00; G01R 31/02
[52] U.S. Cl. ...................... 324/158 R; 324/158 D; 324/158 P; 437/8; 357/45
[58] Field of Search ............ 324/158 P, 158 F, 158 R, 324/158 D, 158 T, 158, 72.5; 437/8; 357/45

[56] References Cited

U.S. PATENT DOCUMENTS

| | | | |
|---|---|---|---|
| 3,839,781 | 10/1974 | Russell | 437/8 |
| 3,842,346 | 10/1974 | Bobbitt | 324/158 F |
| 3,849,872 | 11/1974 | Hubacher | 437/8 |
| 3,882,532 | 5/1975 | Quinn | 357/17 |
| 3,979,671 | 9/1976 | Meeker et al. | 324/158 F |
| 3,984,860 | 10/1976 | Logue | 437/8 |
| 4,244,048 | 1/1981 | Tsui | 371/22.3 |
| 4,281,449 | 8/1981 | Ports et al. | 324/158 R |
| 4,467,400 | 8/1984 | Stopper | 357/45 |
| 4,500,836 | 2/1985 | Stundacher | 324/158 T |
| 4,503,335 | 3/1985 | Takahashi | 324/158 F |
| 4,567,432 | 1/1986 | Buol et al. | 324/158 P |
| 4,684,884 | 8/1987 | Soderlund | 324/158 R |
| 4,799,009 | 1/1989 | Tada et al. | 324/72.5 |
| 4,812,742 | 3/1989 | Abel et al. | 324/538 |

Primary Examiner—Kenneth A. Wieder
Assistant Examiner—William J. Burns
Attorney, Agent, or Firm—Edward W. Callan

[57] ABSTRACT

A wafer containing an array of integrated circuit dice, wherein the dice are separated by scribe lanes in which the wafer may be cut to dice the wafer into individual die, is so constructed as to enable burn-in testing of the integrated circuits while they are still in the wafer. In this wafer, individual integrated circuits of the array include contact pads that extend into the scribe lanes for use during burn-in testing of the integrated circuits while they are contained in the wafer. A system for testing such a wafer includes a testing station for applying and monitoring burn-in test signals for individual integrated circuits; and contact probes for coupling the testing station to the contact pads for a plurality of the individual integrated circuits to enable separate burn-in tests to be conducted simultaneously for a plurality of the individual integrated circuits while they are contained in the wafer. Control means are coupled to the testing means for discontinuing the application of burn-in test signals to a given individual integrated circuit when the monitored test signals for the given integrated circuit indicate that the given integrated circuit has failed the burn-in test.

9 Claims, 1 Drawing Sheet

WAFER-LEVEL BURN-IN TESTING OF INTEGRATED CIRCUITS

BACKGROUND OF THE INVENTION

The present invention generally pertains to burn-in testing of integrated circuits that are fabricated simultaneously in a wafer, and is particularly directed to an improvement in the wafer that facilitates burn-in testing of integrated circuits at the wafer level.

Burn-in testing of an integrated circuit chip is a procedure wherein the chip is operated at a predetermined temperature level over a prolonged period. Power is applied to certain contacts of the chip; and the performance of the chip during the burn-in period is measured by monitoring test signals produced at certain other contacts of the chip.

In the prior art many integrated circuits are fabricated simultaneously in a single wafer. The wafer contains an array of integrated circuit dice, with the dice being separated by scribe lanes in which the wafer is cut to dice the wafer into individual die. For functionality testing the separated individual chips are tested individually. However, for burn-in testing one practice has been to assemble a plurality of the separated individual integrated circuit chips that have passed functionality testing into a single functional module. Modules that pass burn-in testing eventually are assembled into products. Another prior-art burn-in testing practice has been to burn in an individual single integrated circuit die that has been packaged with pins by using a burn-in board having sockets for receiving the pins.

Whenever a single integrated circuit chip of the module fails the burn-in test, the entire module may be discarded if the module is unrepairable in view of ultrafine surface features of the module and dense packing of the chips into the modules. Thus the failure of a single chip during the burn-in test results in a discard-cost factor that is several times the cost of a single chip. For example, when a multi-chip module substrate with a bare, tested cost of $200.00 is assembled with ten chips having an average cost of $50.00 each, and the assembly and burn-in-test for a completed module costs are typically $100.00, the failure of a single $50.00 chip results in scrapping an $800.00 module.

SUMMARY OF THE INVENTION

The present invention provides a wafer that is so constructed as to enable burn-in testing of the integrated circuits while they are still in the wafer, and thereby greatly reduces the discard-cost factor for failure of a single chip and also greatly increases the production yield of both the chips and the modules.

The present invention provides a wafer containing an array of integrated circuit dice, wherein the dice are separated by scribe lanes in which the wafer may be cut to dice the wafer into individual die; and wherein individual integrated circuits of the array include contact pads that extend from only said individual integrated circuit into the scribe lanes for use during burn-in testing of the integrated circuits while they are contained in the wafer.

The present invention also provides a system for testing a wafer containing an array of integrated circuit dice, wherein the dice are separated by scribe lanes in which the wafer may be cut to dice the wafer into individual die, and wherein individual integrated circuits of the array include contact pads that extend from only said individual integrated circuit into the scribe lanes for use during burn-in testing of the integrated circuits while they are contained in the wafer. The testing system of the present invention includes testing means for simultaneously applying and separately monitoring burn-in test signals for individual integrated circuits; and contact means for coupling said testing means to said contact pads for a plurality of said individual integrated circuits to enable separate burn-in tests to be conducted simultaneously for a plurality of said individual integrated circuits while they are contained in the wafer.

Preferably, the testing system further includes control means coupled to said testing means for discontinuing the application of burn-in test signals to a given individual integrated circuit when said monitored test signals for said given integrated circuit indicate that said given integrated circuit has failed the burn-in test.

The present invention also provides a method of testing a wafer containing an array of integrated circuit dice, wherein the dice are separated by scribe lanes in which the wafer may be cut to dice the wafer into individual die, and wherein individual integrated circuits of the array include contact pads that extend from only said individual integrated circuit into the scribe lanes for use during burn-in testing of the integrated circuits while they are contained in the wafer. The method includes the steps of (a) coupling testing means for applying and monitoring burn-in test signals for individual integrated circuits to said contact pads for a plurality of said individual integrated circuits to enable separate burn-in tests to be conducted simultaneously for said plurality of individual integrated circuits while they are contained in the wafer; (b) simultaneously applying burn-in test signals to the coupled individual integrated circuits while they are contained in the wafer; and (c) separately monitoring burn-in test signals for the coupled individual integrated circuits while they are contained in the wafer.

Preferably the method of the present invention further includes the step of (d) discontinuing the application of burn-in test signals to a given individual integrated circuit when said monitored test signals for said given integrated circuit indicate that said given integrated circuit has failed the burn-in test.

Additional features of the present invention are described in relation to the description of the preferred embodiment.

DESCRIPTION OF THE PREFERRED EMBODIMENT

Figure 1:
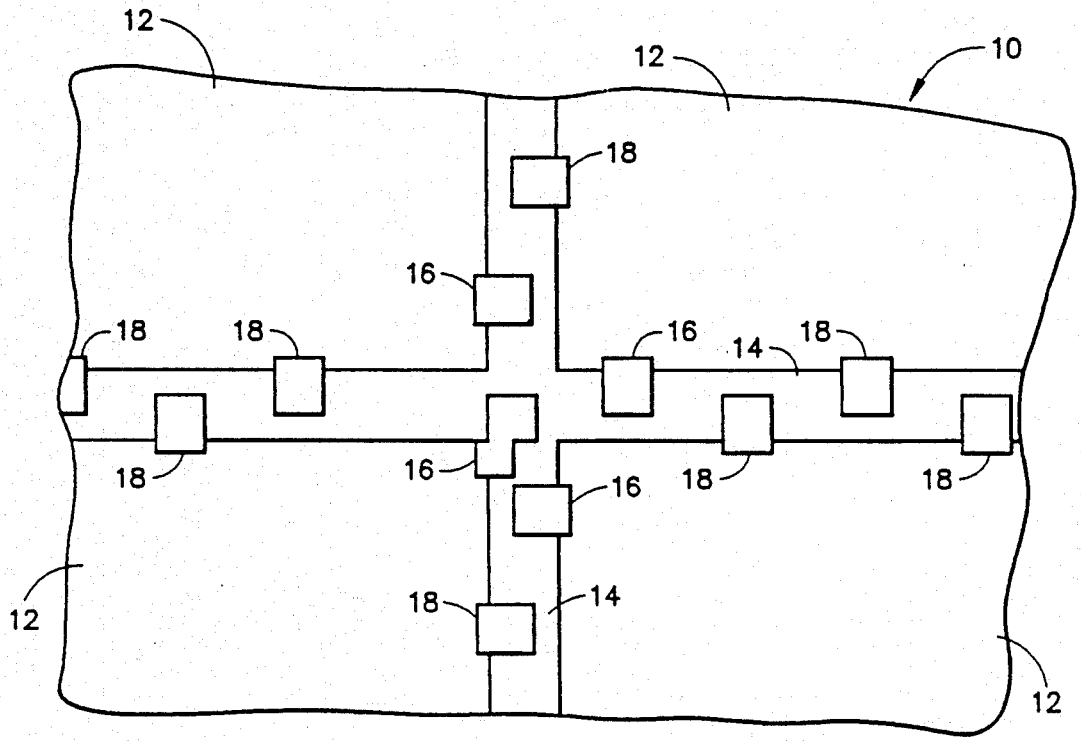
FIG. 1 is a plan view of a cut-away portion of a wafer according to the present invention.

Referring to FIG. 1, a preferred embodiment of a wafer 10 according to the present invention includes a plurality of integrated circuit chip dice 12. A typical 15 cm wafer has an area of approximately 175 cm$^2$ and contains approximately 250 dice having an average area of 55 mm$^2$.

The dice 12 are separated by scribe lanes 14 in which the wafer 10 may be cut to dice the wafer 10 into individual die 12.

The individual integrated circuits 12 of the array include contact pads 16 and 18 that extend into the scribe lanes 14 for use during burn-in testing of the integrated circuits 12 while they are contained in the wafer 10. The scribe lanes 14 are approximately 0.3 mm wide and the contact pads 16 and 18 extend into the scribe lanes 14 by approximately 0.2 mm.

The scribe lanes 14 are disposed parallel and perpendicular to one another to define an array of rectangular integrated circuits 12. A first set of four contact pads 16 extend into the scribe lanes 14 from areas of the integrated circuits 12 at the corners near the intersections of the scribe lanes 14 for use in providing test stimulus signals during testing. One contact pad 16 extends into the scribe lanes 14 from each of the four integrated circuit dice 12 defined by the scribe lanes 14 at each intersection. A second set of the contact pads 18 extend into the scribe lanes 14 from areas of the integrated circuits 12 outside the intersections of the scribe lanes 14 for use in providing power to the integrated circuits 12 during said testing. In those portions of the scribe lanes 14 located away from the intersections, alternate contact pads 18 extend into the scribe lane 14 from dice 12 on opposite sides of the scribe lane 14.

Figure 2:
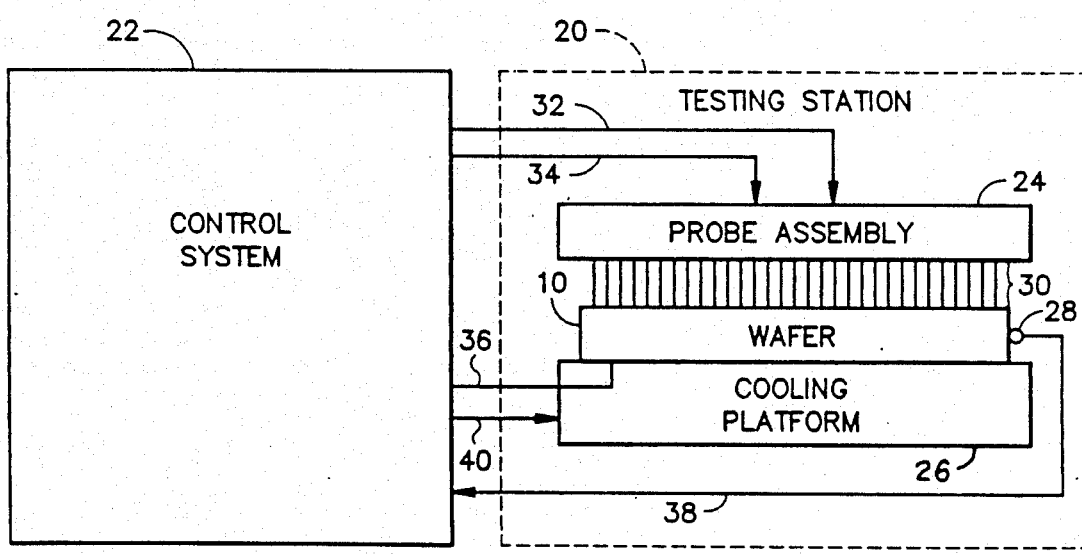
FIG. 2 is a diagram of a testing system according to the present invention.

Referring to FIG. 2, a preferred embodiment of the testing system of the present invention includes a test station 20 and a control system 22. The test station 20 includes a probe assembly 24, a cooling platform 26 and a temperature sensor 28.

The probe assembly 24 contains an array of contact probes 30 that are aligned in the same configuration as the extended contact pads 16, 18 of the wafer 10. Those contact probes 30 that contact the extended contact probes 16 for providing test stimulus signals to the integrated circuits 12 of the wafer 10 during testing are thus aligned to be conveniently clustered at each intersection of the scribe lanes 14 in the wafer 10.

A wafer 10 is received on the cooling platform 26 for testing; and the probe assembly 24 is positioned to bring the contact probes 30 into electrical contact with the extended contact pads 16, 18 of the wafer 10. The control system 22 provides DC power to the contact pads 18 via lines 32 and those of the probe contacts 30 that are aligned with the contact pads 18. The control system 22 further provides AC test stimulus signals to the contact pads 16 via lines 34 and those of the probe contacts 30 that are aligned with the contact pads 16. Line 36 is connected to the conductive back side of the wafer 10 to provide an electrical return path to the control system 22. The DC power and AC test stimulus signals generate heat in the wafer 10 by thermoelectric internal heating. Each individual integrated circuit 12 is powered and stimulated separately to conduct an separate burn-in test for each individual integrated circuit 12. The separate burn-in tests for the individual integrated circuits 12 are conducted simultaneously for those integrated circuits that have not failed a prior functionality test.

The performance of each integrated circuit 12 is separately monitored by the control system 22 by separately measuring the current of the DC power provided on lines 32 to the extended contacts 18 of each integrated circuit 12. When the measured current in a given integrated circuit 12 is above a predetermined threshold, the control system 22 determines that the given integrated circuit 12 has failed the burn-in test, and thereupon discontinues providing power and test stimulus signals via those contact probes 30 that are in contact with the given integrated circuit 12. The location of the failed integrated circuit 12 is stored in a computer memory in the control system, so that the failed integrated circuit 12 can be identified and segregated from the other integrated circuits 12 when the wafer 10 is diced after the burn-in test has been completed.

The test stimulus, under power, provides the internal energy level for burn-in stress screening at approximately 150° C. for 48 hours or whatever temperature and length of time are desired.

The temperature of the wafer 10 is monitored by the control system 22 by processing a temperature signal provided on line 38 by the temperature sensor 28, which is attached to the wafer 10 for sensing the temperature of the wafer 10. The temperature of the wafer 10 may be controlled by varying the supply voltage of the DC power on lines 32, the frequency of the AC test stimulus signals on lines 34 and the temperature of the cooling platform 26. The temperature of the cooling platform 26 is varied by varying the flow of coolant through the cooling platform 26 in accordance with a control signal provided on line 40 to the cooling platform 26. The control system 22 controls one or a combination of these three variables in accordance with the temperature signals received on line 38 to maintain the wafer 10 at the desired temperature.

We claim:

1. A wafer containing an array of integrated circuit dice,
   wherein the dice are separated by scribe lanes in which the wafer may be cut to dice the wafer into individual die; and
   wherein individual integrated circuits of the array include contact pads that extend from only said individual integrated circuit into the scribe lanes for use during burn-in testing of the integrated circuits while they are contained in the wafer.

2. A wafer according to claim 1, in which the scribe lines are disposed parallel and perpendicular to one another to define an array of rectangular integrated circuits,
   wherein a first set of said contact pads extend into said scribe lanes from areas of the integrated circuits near the intersections of the scribe lines for use in providing test stimulus signals during said testing; and
   wherein a second set of said contact pads extend into the scribe lanes from areas of the integrated circuits outside the intersections of the scribe lines for use in providing power to the integrated circuits during said testing.

3. A system for testing a wafer containing an array of integrated circuit dice, wherein the dice are separated by scribe lanes in which the wafer may be cut to dice the wafer into individual die, and wherein individual integrated circuits of the array include contact pads that extend from only said individual integrated circuit into the scribe lanes for use during burn-in testing of the integrated circuits while they are contained in the wafer, the system comprising
   testing means for simultaneously applying and separately monitoring burn-in test signals for individual integrated circuits; and
   contact means for coupling said testing means to said contact pads for a plurality of said individual integrated circuits to enable separate burn-in tests to be conducted simultaneously for a plurality of said individual integrated circuits while they are contained in the wafer.

4. A system according to claim 3, further comprising control means coupled to said testing means for discontinuing the application of burn-in test signals to a given individual integrated circuit when said monitored test signals for said given integrated circuit indicate that said given integrated circuit has failed the burn-in test.

5. A system according to claim 3, for testing a wafer in which the scribe lines are disposed parallel and perpendicular to one another to define an array of rectangular integrated circuits, and in which first sets of said contact pads extend into said scribe lanes from areas of the integrated circuits near the intersections of the scribe lines, wherein the contact means include clusters of probes for contacting the first sets of contact pads in those areas of the wafer near the intersections of the scribe lines for providing test stimulus signals to the integrated circuits during said testing.

6. A system according to claim 5, for testing a wafer in which second sets of said contact pads extend into said scribe lanes from areas of the integrated circuits outside the intersections of the scribe lines, wherein the contact means further include probes for contacting the second sets of contact pads in those areas of the wafer outside the intersections of the scribe lines for providing power to the integrated circuits during said testing.

7. A system according to claim 3, further comprising means for sensing the temperature of the wafer during said testing;

cooling means for receiving the wafer during said testing; and control means coupled to said sensing means, said cooling means and the testing means for controlling the temperature of wafer during said testing by controlling said cooling means, varying said power, and/or varying said test stimulus signals in accordance with the sensed temperature of the wafer.

8. A method of testing a wafer containing an array of integrated circuit dice, wherein the dice are separated by scribe lanes in which the wafer may be cut to dice the wafer into individual die, and wherein individual integrated circuits of the array include contact pads that extend from only said individual integrated circuit into the scribe lanes for use during burn-in testing of the integrated circuits while they are contained in the wafer, the method comprising the steps of (a) coupling testing means for applying and monitoring burn-in test signals for individual integrated circuits to said contact pads for a plurality of said individual integrated circuits to enable separate burn-in tests to be conducted simultaneously for said plurality of individual integrated circuits while they are contained in the wafer;

(b) simultaneously applying burn-in test signals to the coupled plurality of individual integrated circuits while they are contained in the wafer; and (c) separately monitoring burn-in test signals for the coupled individual integrated circuits while they are contained in the wafer.

9. A method according to claim 8 further comprising the step of (d) discontinuing the application of burn-in test signals to a given individual integrated circuit when said monitored test signals for said given integrated circuit indicate that said given integrated circuit has failed the burn-in test.

* * * * *